United States Patent
Blakely et al.

(10) Patent No.: US 10,903,830 B2
(45) Date of Patent: Jan. 26, 2021

(54) SHORT-CIRCUIT PROTECTION FOR A POWER SEMICONDUCTOR DEVICE

(71) Applicant: Nexus Technologies, Inc., Fletcher, NC (US)

(72) Inventors: John H. Blakely, Weaverville, NC (US); Daniel J. Conti, Weaverville, NC (US); Edward C. Prather, Hendersonville, NC (US); Norman P. Davies, Asheville, NC (US); Brian C. Langford, Hendersonville, NC (US); Ronald D. Hreha, Asheville, NC (US); Belvin S. Freeman, Asheville, NC (US)

(73) Assignee: Nexus Technologies, Inc., Fletcher, NC (US)

(*) Notice: Subject to any disclaimer, the term of this patent is extended or adjusted under 35 U.S.C. 154(b) by 307 days.

(21) Appl. No.: 16/003,512

(22) Filed: Jun. 8, 2018

(65) Prior Publication Data

US 2018/0358959 A1 Dec. 13, 2018

Related U.S. Application Data

(60) Provisional application No. 62/517,020, filed on Jun. 8, 2017.

(51) Int. Cl.
*H03K 17/082* (2006.01)
*H03K 5/1252* (2006.01)
(Continued)

(52) U.S. Cl.
CPC ......... *H03K 17/082* (2013.01); *H02H 1/0007* (2013.01); *H03K 3/037* (2013.01); *H03K 5/1252* (2013.01); *H03K 17/0822* (2013.01)

(58) Field of Classification Search
USPC .................................................. 361/93, 93.1
See application file for complete search history.

(56) References Cited

U.S. PATENT DOCUMENTS

| 5,500,616 A | 3/1996 | Ochi |
| 6,097,582 A * | 8/2000 | John ................... H03K 17/165 |
| | | 361/79 |

(Continued)

OTHER PUBLICATIONS

International Search Report dated Aug. 29, 2018 in corresponding International application No. PCT/IB2018/054178 filed Jun. 8, 2018.

*Primary Examiner* — Yemane Mehari
(74) *Attorney, Agent, or Firm* — Womble Bond Dickinson (US) LLP

(57) ABSTRACT

A desaturation detector receives signals from a gate driver and circuitry that indicate whether a power semiconductor device is on and in desaturation. A logic circuit produces a signal as a function of the signals, from which a latch circuit produces an output signal. The signal has first and second values respectively in an as-designed condition, and in a short-circuit condition in which the power semiconductor device is on and in desaturation. The output signal has the first value, and transitioned and latched to the second value in response to a transition to the short-circuit condition, which causes the gate driver to switch the power semiconductor device off. And filter(s) reduce noise within the desaturation detector.

24 Claims, 3 Drawing Sheets

(51) Int. Cl.
*H03K 3/037* (2006.01)
*H02H 1/00* (2006.01)

(56) References Cited

U.S. PATENT DOCUMENTS

| | | | |
|---|---|---|---|
| 9,059,076 B2 * | 6/2015 | Wu | H03K 17/163 |
| 10,126,375 B2 * | 11/2018 | Ko | G01R 1/30 |
| 10,473,710 B2 * | 11/2019 | Sullivan | G01R 31/2608 |
| 2012/0108883 A1 * | 5/2012 | Peterchev | A61N 2/02 |
| | | | 600/14 |
| 2017/0122996 A1 | 5/2017 | Sullivan | |
| 2017/0294907 A1 * | 10/2017 | Volke | H03K 17/082 |
| 2019/0280686 A1 * | 9/2019 | Lu | H03K 17/0828 |

\* cited by examiner

SHORT-CIRCUIT PROTECTION FOR A POWER SEMICONDUCTOR DEVICE

CROSS-REFERENCE TO RELATED APPLICATION(S)

The present application claims priority to U.S. Provisional Patent Application No. 62/517,020, entitled: Gallium Nitride Short-Circuit Protection and Method Therefor, filed on Jun. 8, 2017, the content of which is incorporated herein by reference.

TECHNOLOGICAL FIELD

The present disclosure relates generally to semiconductor circuit short-circuit protection and, in particular, to short-circuit protection for gallium nitride (GaN) semiconductor technology.

BACKGROUND

Semiconductor circuits require protection against short circuits because a short circuit destroys the components. Standard semiconductors, such as IGBT (insulated gate bipolar transistor) and MOSFETs (metal oxide semiconductor field-effect transistor), are rated to withstand a short circuit for up to 10 microseconds, and they require short-circuit protection that responds within that period of time. New GaN (gallium nitride) semiconductor technology is an order of magnitude faster than traditional transistors and therefore requires short circuit protection that responds correspondingly at least a magnitude faster. Some GaN power semiconductor devices are rated to withstand a short circuit for only up to 1 microsecond. Existing short circuit protection implementations cannot match that speed; a faster design is required.

In addition to the speed requirement, the protection circuit must not trigger falsely. This is true of all short circuit protection designs, but the faster switching of the GaN parts generates a magnitude or more electrical noise compared to older semiconductors. The new short circuit protection design must be impervious to this added noise in addition to being sufficiently faster.

Therefore it would be desirable to have short-circuit protection that takes into account at least some of the issues discussed above, as well as other possible issues.

BRIEF SUMMARY

Example implementations of the present disclosure provide a robust protection solution that is protected in the event of a short circuit. Not only from a user standpoint of robustness, example implementations also maintain certain aspects of agency requirements. The present disclosure thus includes, without limitation, the following example implementations.

Some example implementations provide a circuit with short-circuit protection, the circuit comprising a power semiconductor device; a gate driver coupled to and configured to provide a gate drive signal to the power semiconductor device, the gate drive signal being controllable to switch the power semiconductor device on and off; circuitry coupled to and configured to detect voltage across the power semiconductor device that indicates whether the power semiconductor device is in desaturation or saturation; and a desaturation detector coupled to the gate driver and circuitry, the desaturation detector being configured to receive a first signal from the gate driver that indicates whether the gate drive signal is being provided to the power semiconductor device and thereby whether the power semiconductor device is off or on, and a second signal from the circuitry that indicates whether the power semiconductor device is in desaturation or saturation, the desaturation detector including at least: a logic circuit configured to produce a third signal as a function of the first signal and the second signal, the third signal being a logic signal that switches between a first value and a second value, the third signal having the first value in an as-designed condition in which the power semiconductor device is off or in saturation, and the second value in a short-circuit condition in which the power semiconductor device is on and in desaturation; a latch circuit configured to produce an output signal as a function of the third signal, the output signal having the first value of the third signal in the as-designed condition, and transitioned and latched to the second value of the third signal in response to a transition from the as-designed condition to the short-circuit condition, the output signal having the second value causing the gate driver to switch the power semiconductor device off; and one or more filters configured to reduce noise within the desaturation detector.

In some example implementations of the circuit of any preceding example implementation, or any combination of any preceding example implementations, the power semiconductor device is rated to withstand a short circuit for up to a defined period of time, and the one or more filters add propagation delay within the desaturation detector such that a period of time from the transition to the power semiconductor device being switched off is no shorter than one-tenth the defined period of time.

In some example implementations of the circuit of any preceding example implementation, or any combination of any preceding example implementations, the power semiconductor device is a gallium nitride (GaN) power semiconductor device rated to withstand a short circuit for up to one microsecond, and the one or more filters are one or more sub-microsecond filters.

In some example implementations of the circuit of any preceding example implementation, or any combination of any preceding example implementations, the one or more filters include input filters before the logic circuit, the input filters being configured to reduce noise in the first signal and the second signal.

In some example implementations of the circuit of any preceding example implementation, or any combination of any preceding example implementations, the first signal and the second signal are respectively a first analog signal and a second analog signal, and the desaturation detector includes a first comparator and a second comparator configured to receive respective ones of the first analog signal and the second analog signal and produce a first logic signal and a second logic signal corresponding thereto, and wherein the logic circuit being configured to produce the third signal includes being configured to produce the third signal as a function of the first logic signal and the second logic signal.

In some example implementations of the circuit of any preceding example implementation, or any combination of any preceding example implementations, the first logic signal switches between the first value and the second value when the power semiconductor device is respectively off and on, and the second logic signal switches between the first value and the second value when the power semiconductor device is in respectively saturation and desaturation, and wherein the logic circuit being configured to produce the third signal includes being configured to produce the third signal as a logical conjunction of the first logic signal and the second logic signal.

In some example implementations of the circuit of any preceding example implementation, or any combination of any preceding example implementations, the one or more filters include a filter between the logic circuit and the latch circuit, the filter being configured to reduce noise in the third signal.

In some example implementations of the circuit of any preceding example implementation, or any combination of any preceding example implementations, the one or more filters include at least one filter internal to the latch circuit, the at least one filter being configured to reduce noise and add propagation delay within the latch circuit.

In some example implementations of the circuit of any preceding example implementation, or any combination of any preceding example implementations, the latch circuit includes at least a summing junction configured to produce a summing signal as a sum of the third signal and the output signal; a first filter and a first inverter configured to respectively filter and invert the summing signal to produce a first filtered and inverted signal; and a second filter and a second inverter configured to respectively filter and invert the first filtered and inverted signal to produce a second filtered and inverted signal that is the output signal, wherein the one or more filters include at least the first filter and the second filter.

In some example implementations of the circuit of any preceding example implementation, or any combination of any preceding example implementations, the latch circuit further includes a feedback path on which the output signal is fed back from an output of the second inverter to the summing junction.

In some example implementations of the circuit of any preceding example implementation, or any combination of any preceding example implementations, the feedback path includes a diode and a resistor.

In some example implementations of the circuit of any preceding example implementation, or any combination of any preceding example implementations, the output signal latched to the second value is cleared to the first value in response to the feedback path being pulled to a low voltage level that corresponds to the first value.

Some example implementations provide a desaturation detector for a circuit with short-circuit protection, the desaturation detector being configured to receive a first signal from a gate driver that indicates whether a gate drive signal is being provided to a power semiconductor device and thereby whether the power semiconductor device is off or on, and a second signal from circuitry that indicates whether the power semiconductor device is in desaturation or saturation, the desaturation detector comprising a logic circuit configured to produce a third signal as a function of the first signal and the second signal, the third signal being a logic signal that switches between a first value and a second value, the third signal having the first value in an as-designed condition in which the power semiconductor device is off or in saturation, and the second value in a short-circuit condition in which the power semiconductor device is on and in desaturation; a latch circuit configured to produce an output signal as a function of the third signal, the output signal having the first value of the third signal in the as-designed condition, and transitioned and latched to the second value of the third signal in response to a transition from the as-designed condition to the short-circuit condition, the output signal having the second value causing the gate driver to switch the power semiconductor device off; and one or more filters configured to reduce noise within the desaturation detector.

In some example implementations of the desaturation detector of any preceding example implementation, or any combination of any preceding example implementations, the power semiconductor device is rated to withstand a short circuit for up to a defined period of time, and the one or more filters add propagation delay within the desaturation detector such that a period of time from the transition to the power semiconductor device being switched off is no shorter than one-tenth the defined period of time.

In some example implementations of the desaturation detector of any preceding example implementation, or any combination of any preceding example implementations, the power semiconductor device is a gallium nitride (GaN) power semiconductor device rated to withstand a short circuit for up to one microsecond, and the one or more filters are one or more sub-microsecond filters.

In some example implementations of the desaturation detector of any preceding example implementation, or any combination of any preceding example implementations, the one or more filters include input filters before the logic circuit, the input filters being configured to reduce noise in the first signal and the second signal.

In some example implementations of the desaturation detector of any preceding example implementation, or any combination of any preceding example implementations, the first signal and the second signal are respectively a first analog signal and a second analog signal, and the desaturation detector includes a first comparator and a second comparator configured to receive respective ones of the first analog signal and the second analog signal and produce a first logic signal and a second logic signal corresponding thereto, and wherein the logic circuit being configured to produce the third signal includes being configured to produce the third signal as a function of the first logic signal and the second logic signal.

In some example implementations of the desaturation detector of any preceding example implementation, or any combination of any preceding example implementations, the first logic signal switches between the first value and the second value when the power semiconductor device is respectively off and on, and the second logic signal switches between the first value and the second value when the power semiconductor device is in respectively saturation and desaturation, and wherein the logic circuit being configured to produce the third signal includes being configured to produce the third signal as a logical conjunction of the first logic signal and the second logic signal.

In some example implementations of the desaturation detector of any preceding example implementation, or any combination of any preceding example implementations, the one or more filters include a filter between the logic circuit and the latch circuit, the filter being configured to reduce noise in the third signal.

In some example implementations of the desaturation detector of any preceding example implementation, or any combination of any preceding example implementations, the one or more filters include at least one filter internal to the latch circuit, the at least one filter being configured to reduce noise and add propagation delay within the latch circuit.

In some example implementations of the desaturation detector of any preceding example implementation, or any combination of any preceding example implementations, the latch circuit includes at least a summing junction configured to produce a summing signal as a sum of the third signal and the output signal; a first filter and a first inverter configured to respectively filter and invert the summing signal to produce a first filtered and inverted signal; and a second filter and a second inverter configured to respectively filter and invert the first filtered and inverted signal to produce a second filtered and inverted signal that is the output signal, wherein the one or more filters include at least the first filter and the second filter.

In some example implementations of the desaturation detector of any preceding example implementation, or any combination of any preceding example implementations, the latch circuit further includes a feedback path on which the output signal is fed back from an output of the second inverter to the summing junction.

In some example implementations of the desaturation detector of any preceding example implementation, or any combination of any preceding example implementations, the feedback path includes a diode and a resistor.

In some example implementations of the desaturation detector of any preceding example implementation, or any combination of any preceding example implementations, the output signal latched to the second value is cleared to the first value in response to the feedback path being pulled to a low voltage level that corresponds to the first value.

These and other features, aspects, and advantages of the present disclosure will be apparent from a reading of the following detailed description together with the accompanying figures, which are briefly described below. The present disclosure includes any combination of two, three, four or more features or elements set forth in this disclosure, regardless of whether such features or elements are expressly combined or otherwise recited in a specific example implementation described herein. This disclosure is intended to be read holistically such that any separable features or elements of the disclosure, in any of its aspects and example implementations, should be viewed as combinable unless the context of the disclosure clearly dictates otherwise.

It will therefore be appreciated that this Brief Summary is provided merely for purposes of summarizing some example implementations so as to provide a basic understanding of some aspects of the disclosure. Accordingly, it will be appreciated that the above described example implementations are merely examples and should not be construed to narrow the scope or spirit of the disclosure in any way. Other example implementations, aspects and advantages will become apparent from the following detailed description taken in conjunction with the accompanying figures which illustrate, by way of example, the principles of some described example implementations.

BRIEF DESCRIPTION OF THE FIGURE(S)

Having thus described example implementations of the disclosure in general terms, reference will now be made to the accompanying figures, which are not necessarily drawn to scale, and wherein:

DETAILED DESCRIPTION

The present disclosure is described more fully hereinafter with reference to example implementations thereof. These example implementations are described so that this disclosure will be thorough and complete, and will fully convey the scope of the disclosure to those skilled in the art. Indeed, the disclosure may be embodied in many different forms and should not be construed as limited to the implementations set forth herein; rather, these implementations are provided so that this disclosure will satisfy applicable legal requirements. As used in the specification and the appended claims, for example, the singular forms "a," "an," "the" and the like include plural referents unless the context clearly dictates otherwise. Also, for example, reference may be made herein to quantitative measures, values, relationships or the like. Unless otherwise stated, any one or more if not all of these may be absolute or approximate to account for acceptable variations that may occur, such as those due to engineering tolerances or the like.

Example implementations of the present disclosure are generally to semiconductor short-circuit protection and, in particular, to short-circuit protection for gallium nitride (GaN) semiconductor technology. Although described in the context of GaN semiconductor technology, it should be understood that example implementations may be equally applied to other semiconductor technologies.

As explained in the Background section, traditional power semiconductors such as IGBTs and MOSFETs typically require short circuit times on the order of 10 microseconds ($\mu$sec). When reducing the short circuit time from 10 $\mu$sec to within an order of magnitude less than 1 $\mu$sec for GaN devices, a faster detection time (consequently a faster circuit) response is needed, which may dictate a reduction in filtering. Given that power semiconductor di/dt and dv/dt are now also a magnitude in order faster for GaN devices, the coupled noise into faster circuits with less filtering creates a difficult situation.

These circuits are now much more prone to false triggering which is compounded by a possible latch requirement. The latch must not latch at such a fast rate that the circuit errantly false fires and latches off the GaN. Commercially available discrete latches typically operate at a speed much faster than 1 $\mu$sec, more on the order of 300 picoseconds (psec) to 100 nanoseconds (nsec). A second problem with a discrete latch is the inability to filter each internal stage of the latch itself, which in some instances may lead to an errant false fire at a faster internal stage of the latch.

Figure 1:
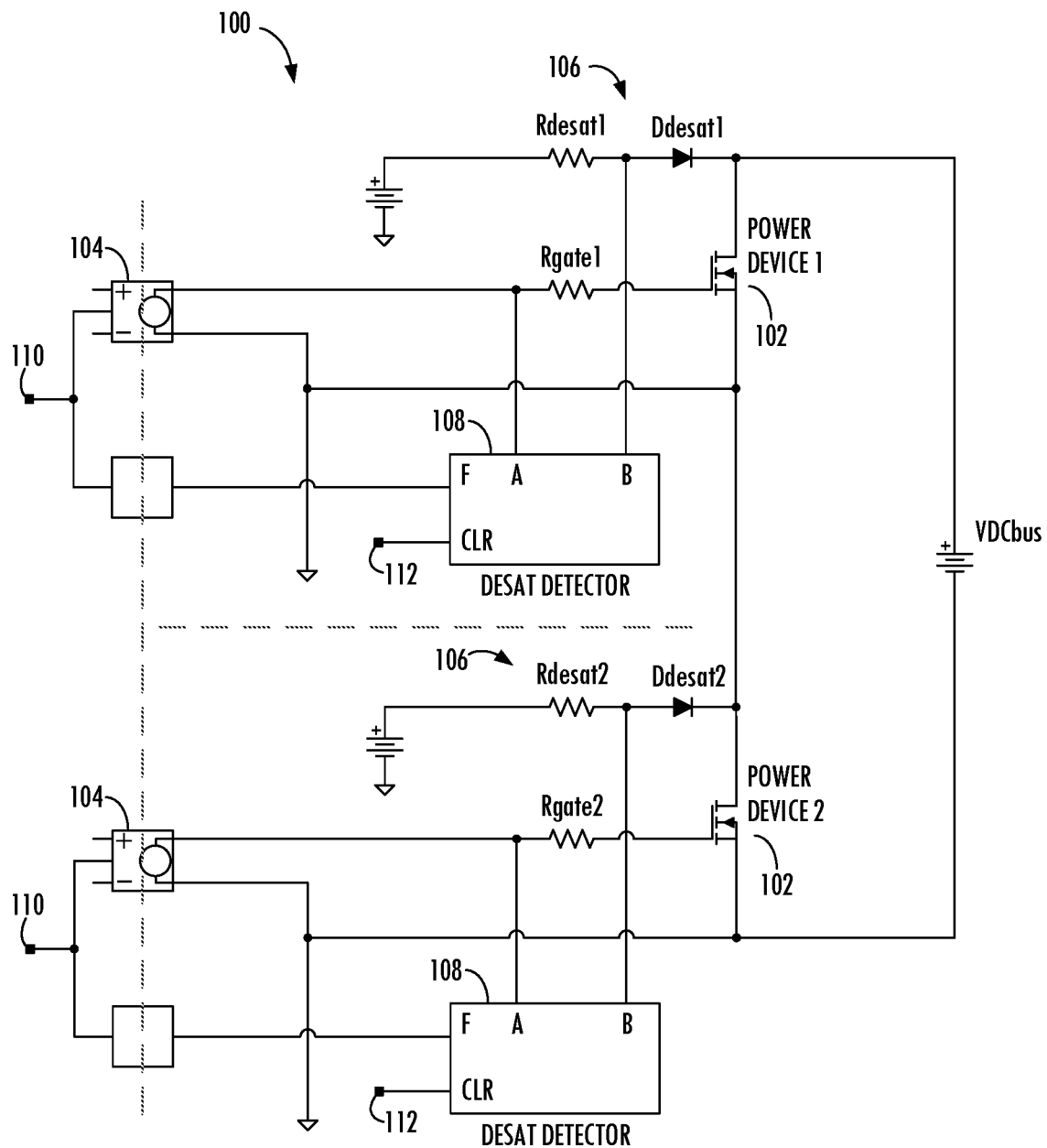
FIG. 1 illustrates a circuit with short-circuit protection, according to example implementations of the present disclosure.

FIG. 1 illustrates a circuit 100 with short-circuit protection, according to example implementations of the present disclosure. The circuit includes one or more of each of a number of components. In some examples, the circuit includes a power semiconductor device 102, a gate driver 104, circuitry 106 and a desaturation detector 108. As shown, the circuit includes two of each of the components, but the circuit in other examples may include more or less of one or more of the components. In particular, for example, the circuit may include a first power semiconductor device (power device 1), and a second power semiconductor device (power device 2), either of which may be simply referred to as the power semiconductor device.

In some examples, the power semiconductor device 102 is rated to withstand a short circuit for up to a defined period of time. As indicated above, one example of a suitable power semiconductor device is a GaN power semiconductor device rated to withstand a short circuit for up to one microsecond (1 $\mu$sec).

As shown, the gate driver 104 is coupled to and configured to provide a gate drive signal to the power semiconductor device 102, with the gate drive signal being controllable to switch the power semiconductor device on and off.

The circuitry 106 is coupled to and configured to detect voltage across the power semiconductor device that indicates whether the power semiconductor device is in desaturation. The desaturation detector 108 is coupled to the gate driver and circuitry, and configured to detect a short-circuit condition in which the power semiconductor device is on and in desaturation. In this condition, an output signal from the desaturation detector may be used to switch off the power semiconductor device.

In some examples, the desaturation detector 108 is configured to receive a first signal A from the gate driver 104 that indicates whether the gate drive signal is being provided to the power semiconductor device 102 and thereby whether the power semiconductor device is off or on. The desaturation detector is configured to receive a second signal B from the circuitry 106 that indicates whether the power semiconductor device is in desaturation or saturation. The desaturation signal may then produce an output signal F as a function of the first and second signals A, B. This output signal may be a logic signal that switches between a first value and a second value. As described herein, in some examples, the first value and second value are respectively binary 0 and 1, but the values may be reversed in other examples.

According to example implementations, the output signal F may have the first value (0) in an as-designed condition in which the power semiconductor device 102 is off or in saturation, and the second value (1) in a short-circuit condition in which the power semiconductor device is on and in desaturation. During transition from the as-designed condition to the short-circuit condition, the output signal may transition from the first value to the second value, and the desaturation detector 108 may latch the output signal to the second value. This output signal having the second value, then, may cause the gate driver 104 to switch the power semiconductor device 102 off.

To reduce false triggering the desaturation detector 108 may include one or more filters that reduce noise within the desaturation detector, and that in some examples add propagation delay within the desaturation detector such that a period of time from the transition to the power semiconductor device being switched off is no shorter than one-tenth the defined period of time. Thus, for a GaN power semiconductor device rated to withstand a short circuit for up to 1 $\mu sec=1\times10^{-6}$ seconds, the period of time from the transition to the power semiconductor device being switched off is no less than $1\times10^{-7}$ seconds. In more particular examples, the period of time from the transition to the power semiconductor device being switched off is one-half, one-third or between one-half and one-third the defined period of time. The output signal latched to the second value may then at some point be cleared back to the first value.

In some examples, the gate driver 104 may receive the output signal F with the second value and directly switch the power semiconductor device 102 off. In other examples, circuit 100 may include a terminal 110 from which an external electronic component may monitor the output signal, and control the gate driver to switch the power semiconductor device off in response to the output signal with the second value. One example of a suitable external electronic component is a processor such as a microprocessor, microcontroller, application specific integrated circuit (ASIC), field programmable gate array (FPGA) or the like. As also shown, the desaturation detector 108 may be coupled to a terminal 112, from which the same or another external electronic component may clear the output signal latched to the second value back to the first value.

In some examples as described above, during normal, as-designed operation, the two input signals A, B and output signal F of the desaturation detector 108 may be stated as follows:

| Normal Operation | | |
|---|---|---|
| A | B | F |
| 0 | 1 | 0 |
| 1 | 0 | 0 |

When F=0 (first value), the gate driver 104 and circuitry 106 are operating in a normal condition, they form a complimentary function. This function when applied to a logical conjunction (AND) operator will create an output of 0 or low. Any form of logic that performs this regardless of active low or active high as long as the end result is the same.

When the first signal A is high (second value), the Vgs (gate-source voltage) causes the power semiconductor device 102 to switch on, causing Vds (drain-source voltage) to be low (first value). When this low value is below a threshold for the second signal B, the second signal is low. The output signal F will have a logic low. In some examples, the circuit 100 may be designed such that this transition occurs in less than 20 nanoseconds. Filtering on the first and second signals in the desaturation detector 108 may also add a small amount of delay to the transition.

When the first signal A is low (first value), the Vgs causes the power semiconductor device 102 to switch off, causing Vds to be high (first value). This in turn causes the second signal B to be logic high, and output signal F a logic low. Similar to before, this value may be above the threshold for the second signal. This transition also normally occurs in less than 20 nanoseconds. Again, Filtering on the first and second signals in the desaturation detector 108 may also add a small amount of delay to the transition.

During a bus short where the first power semiconductor device 102 involves a bus voltage VDCbus and the second power semiconductor device, an errant condition can occur where the two power semiconductor devices are turned on at the same time. This event causes the power semiconductor devices to form a short circuit on VDCbus. The short circuit current will rise to the point where one or both power semiconductor devices will exit the low voltage Vds or saturated region and enter the linear region where the sum of Vds of the two power semiconductor devices equal VDCbus.

For descriptive purposes, consider the first power semiconductor device 102 entering the linear condition. In this condition, Vgs is high (second value) and the first signal A is therefore logic high. Since the first power semiconductor device is in the linear region, it is operating in a current source mode and therefore Vds is also high, resulting in the second signal B being logic high (second value). The resulting output signal from the desaturation detector 108 is F=1 (second value), as shown below, which can signal the gate driver 104, directly or through an external electronic component, to switch off the first power semiconductor device.

| Short-Circuit Operation | | |
|---|---|---|
| A | B | F |
| 1 | 1 | 1 |

According to some example implementations, the desaturation detector 108 includes filtering in part due to delays in the power semiconductor device 102 for which Vds falling is slightly delayed from the application of Vgs. The desaturation detector may include other internal electronic components to execute the above-described logic and this to may also include filtering and resulting delay. And in examples in which the output signal F is latched in the desaturation detector, this too may include filtering and hence a delay. This filtering in part addresses the possibility of false triggering, with the time from short-circuit to switch off of the power semiconductor device in some examples being no shorter than one-tenth the defined period of time that the power semiconductor device is rated to withstand a short circuit.

Figure 2:
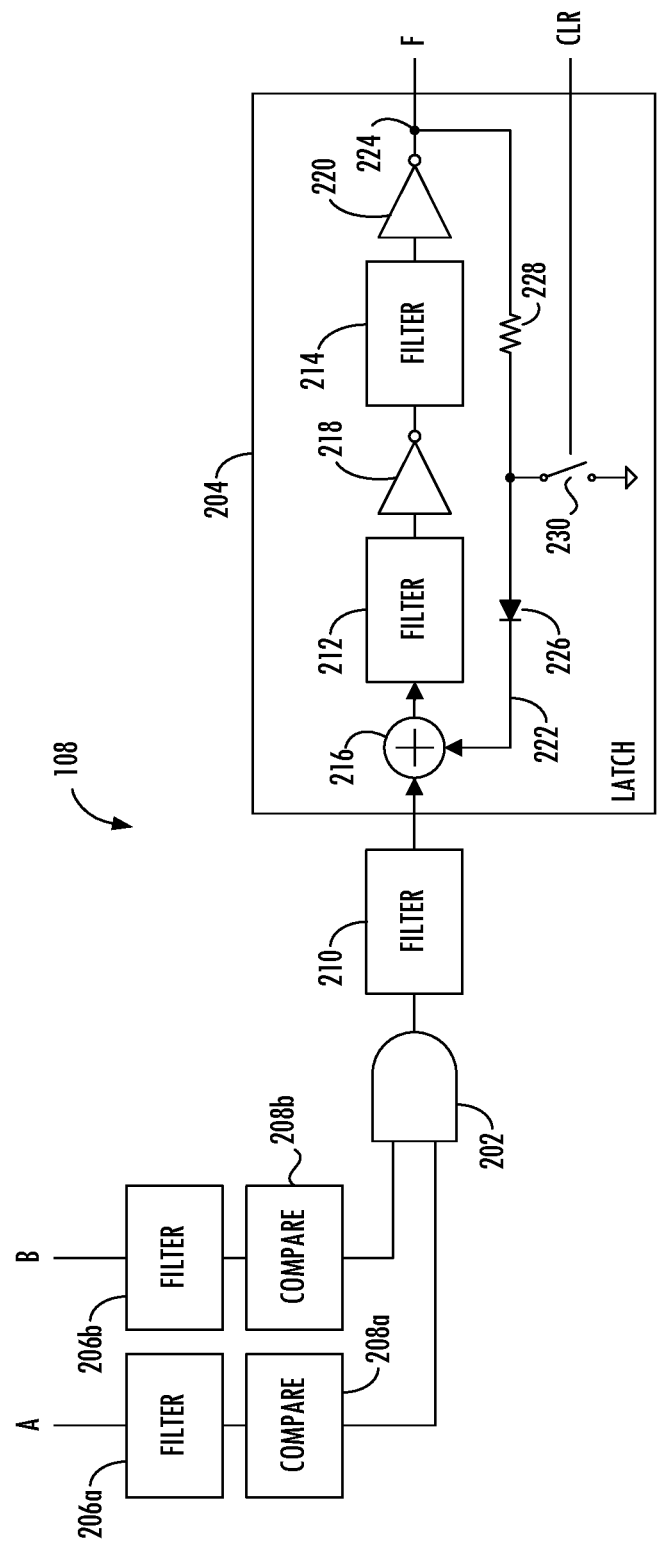
FIG. 2 illustrates a desaturation detector of the circuit of FIG. 1, according to some example implementations.

FIG. 2 illustrates a desaturation detector 108 of the circuit 100 of FIG. 1, according to some example implementations. The desaturation detector includes one or more of each of a number of components. As shown, the desaturation detector includes at least a logic circuit 202, a latch circuit 204, and one or more filters. The logic circuit is configured to produce a third signal as a function of the first signal A and the second signal B. The third signal is a logic signal that switches between a first value (0) and a second value (1). Similar to the output signal F described above, the third signal has the first value in an as-designed condition in which the power semiconductor device is off or in saturation, and the second value (1) in a short-circuit condition in which the power semiconductor device 102 is on and in desaturation.

The latch circuit 204 is configured to produce the output signal F as a function of the third signal. The output signal has the first value of the third signal in the as-designed condition, and is transitioned and latched to the second value of the third signal in response to a transition from the as-designed condition to the short-circuit condition. Again, the output signal having the second value causes the gate driver 104 to switch the power semiconductor device 102 off.

The desaturation detector 108 also includes one or more filters configured to reduce noise and add propagation delay within the desaturation detector such that, in some examples, a period of time from the transition to the power semiconductor device 102 being switched off is no shorter than one-tenth the defined period of time that the power semiconductor device is rated to withstand a short circuit. In examples in which the power semiconductor device is a GaN power semiconductor device, the filer(s) may be sub-microsecond filters. As shown, in some examples, the filter(s) include input filters 206a, 206b before the logic circuit 202. These input filters are configured to reduce noise in the first signal A and the second signal B. Other examples of suitable filters are described below.

In some examples, the first signal A and the second signal B are respectively a first analog signal and a second analog signal. In these examples, the desaturation detector 108 includes a first comparator 208a and a second comparator 208b configured to receive respective ones of the first analog signal and the second analog signal and produce a first logic signal and a second logic signal corresponding thereto. In some further examples, the first logic signal switches between the first value (0) and the second value (1) when the power semiconductor device 102 is respectively off (A=0) and on (A=1). The second logic signal switches between the first value (0) and the second value (1) when the power semiconductor device is in respectively saturation (B=0) and desaturation (B=1). The logic circuit 202, then, may be configured to produce the third signal as a function of the first logic signal and the second logic signal. In particular, for example, the logic circuit may be configured to produce the third signal as a logical conjunction of the first logic signal and the second logic signal (third signal=A∧B).

In some examples, the filter(s) include a filter 210 between the logic circuit 202 and the latch circuit 204, and configured to reduce noise in the third signal. Additionally or alternatively, in some examples, the filter(s) include at least one filter internal to the latch circuit, which may be configured to reduce noise and add propagation delay within the latch circuit.

In a particular example, as shown, the latch circuit 204 includes a summing junction 216, a first filter 212 and a first inverter 218, and a second filter 214 and a second inverter 220. The summing junction is configured to produce a summing signal as a sum of the third signal and the output signal F. The first filter and the first inverter are configured to respectively filter and invert the summing signal to produce a first filtered and inverted signal. And the second filter and the second inverter are configured to respectively filter and invert the first filtered and inverted signal to produce a second filtered and inverted signal that is the output signal.

As also shown, the latch circuit 204 may further include a feedback path 222 on which the output signal is fed back from an output 224 of the second inverter 220 to the summing junction 216. In some examples, the feedback path includes a diode 226 and a resistor 228. And in some examples, the output signal F latched to the second value (1) is cleared to the first value (0) in response to the feedback path being pulled to a low voltage level that corresponds to the first value. This may be accomplished with a switch 230 used to pull the feedback path to the low voltage level.

In some examples as described above, analog first and second signals A, B enter input filters 206a, 206b for noise mitigation, and then enter first and second comparators 208a, 208b for threshold level testing. Each signal is tested for a positive level above a given reference value. If these input values are greater than the respective threshold value, the outputs of the comparators will go logic high. These two signals become inputs to the logic circuit (e.g., AND gate), which follows the above tables in its output of the third signal that is consistent with the output signal F. The third signal is filtered with filter 210 and passed to the latch circuit 204 in which the third signal is summed with the output signal F in summing junction 216. Again, filtering is applied to summing output (first filter 212) and this signal is logically inverted (first inverter 218). The first inverter output is then filtered (second filter 214) and passed through a second inverter 220 to become the output signal F.

Since the output signal F is fed back to the summing junction 216 via feedback path 222 including a diode 226 and resistor 228, the output signal F becomes latched when it transitions from low (first value) to high (second value). If the output signal F is latched high, and the logic circuit 202 output (third signal) is low (normal operation), the CLR line can now be used to clear the latch circuit 204. In some examples, this may be accomplished by transitioning the CLR line voltage to logic low, that causes a node voltage formed by ref the diode, resistor and switch 230 to go low. In turn, the summing output from the summing junction will go low causing the output signal F to return to a logic low. Each of one or more stages in the desaturation detector 108 may include filtering to provide reduce noise particularly in high electrical noise environments, and also as appropriate add propagation delay within the desaturation detector.

Figure 3:
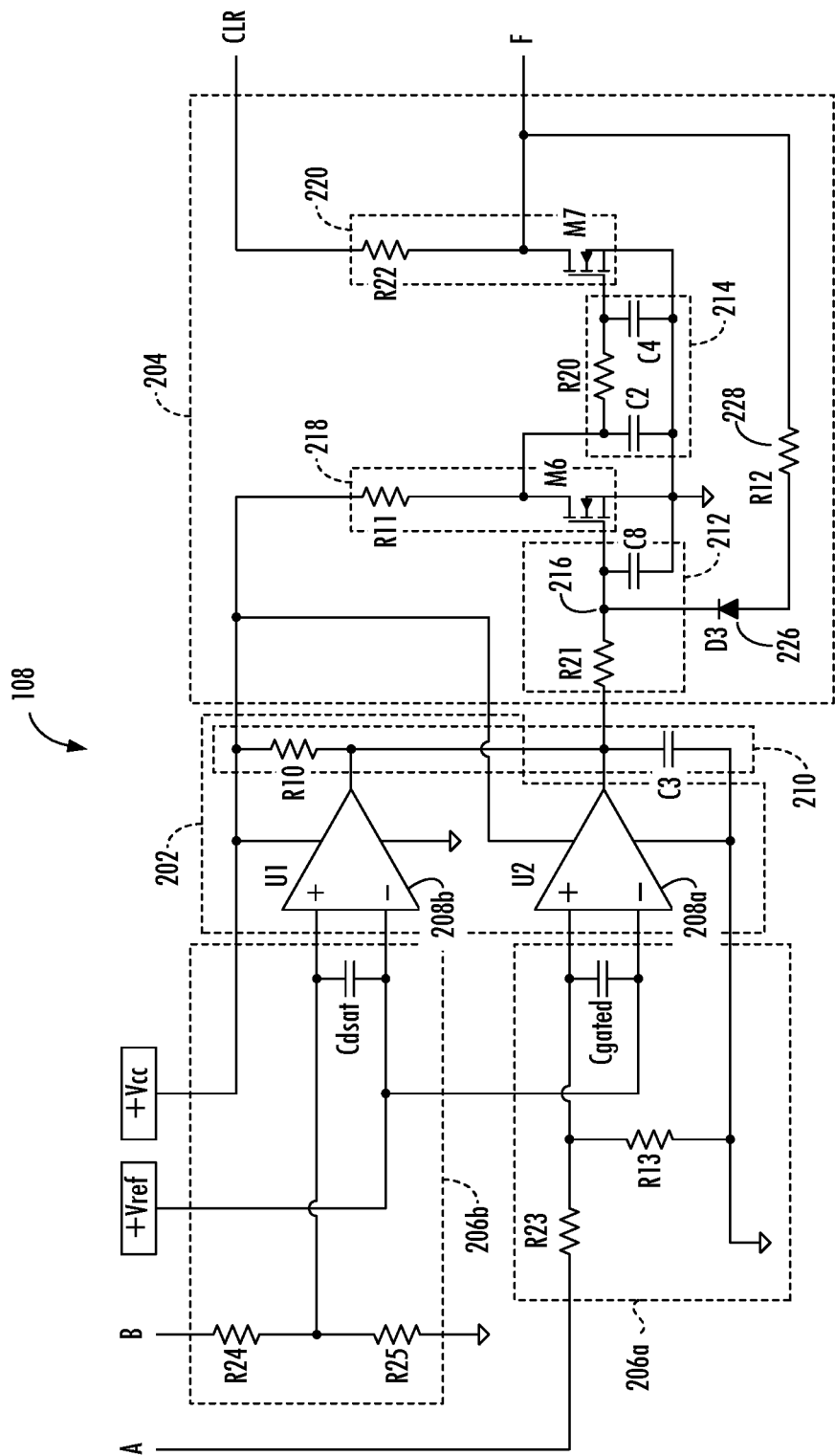
FIG. 3 is a circuit diagram of an implementation of the desaturation detector of FIG. 2, according to some examples.

FIG. 3 is a circuit diagram of an even more particular implementation of the desaturation detector 108 of FIG. 2, according to some examples. As shown, first signal A is used to detect the gate drive signal, second signal B is used to detect power semiconductor device saturation by sensing the power semiconductor device drain-source voltage Vds, and +Vref is a voltage level used to set the comparison levels for comparators U1 and U2 (comparators 208a, 208b). In this implementation, the +Vref signal is shared for convenience but it could be two separate levels.

Resistors R23 and R13 reduce the voltage level of first signal A and also create a Thevenin resistance, Rth1, for use with capacitor Cgated to create a noise filter and delay signal A (first input filter 206a). For a GaN power semiconductor device, it can switch hundreds of volts in a few nanoseconds, in which case the gate-drain capacitance will couple noise into signal A, which may be mitigated by the filter of signal A. When the positive input of comparator U2 rises above its negative input (Vref), the open collector output of U2 will turn off, and resistor R10 will pull the output high if the U1 open collector output is also off. Resistor R10 and capacitor C3 combine to set a time constant that limits how fast either of the outputs of U1 and U2 can transition from low to high, and therefore this stage provides noise filtering and delay (filter 210). For second signal B, resistors R24 and R25 create a voltage divider to reduce the level of signal B and create a Thevenin resistance Rth2. This resistance Rth2 and capacitor Cdesat create a noise filter and delay for signal B (second input filter 206b). For a GaN power semiconductor device, signal B may have significant noise primarily from the switching action of the other GaN devices and parasitic L and C terms. The second input filter may mitigate this noise. When the positive input of U1 rises above its negative input (Vref), the open collector output of U1 will turn off. If the U2 open collector output is also off, resistor R10 will pull the output of U1 high.

In some examples, normal, as-designed operation does not let the open collector outputs of comparators U1 and U2 to be off at the same time, except for very narrow time values less than the R10 and C3 time constant value. This describes the comparators 208a, 208b, logic circuit 202 and filter 210 as shown in FIG. 2.

The U1 and U2 circuitry create comparison tests for normal operation and short circuit. Diode D3, and transistors M6 and M7 create a set-reset (SR) latch function (latch circuit 204). When a short circuit appears, both first and second signals A, B will be/go high. This will cause U1 and U2 open collector outputs to go high at a rate controlled by R10 and C3. Resistor R21 and capacitor C8 create a filter (filter 212) to maintain signal integrity of the M6 drain during noise conditions. The drain of M6 will transition from high to low when U1/U2 output transitions from low to high.

Resistor R11, capacitor C2, resistor R20 and capacitor C4 control the gate voltage on M7. In the short-circuit condition, as the drain of M6 transitions from high to low, the gate of M7 will transition from high to low, but delayed in time by filtering. When the gate of M7 is below the threshold value the drain of M7, output signal F, will transition from low to high. Resistor R22 is a pull up resistor that pulls the drain of M7 high. As the drain of M7 transitions to high, it forward biases D3 providing positive feedback to the M6 gate via resistor R12. This R12 may have a much lower resistance than R21, and therefore the gate of M6 remains latched even after the U1/U2 outputs transition back to low. This will happen when an external electronic component such as a processor senses the high condition on output signal F and turns the gate drive signal off for the power semiconductor device 102. The summing junction 216, two combinations of filter 212, 214 and inverter 218, 220, and the diode 226 as shown in FIG. 2 functionally describe this. The diode feedback into the summing junction creates the latch function.

To reset the fault, output signal F, the +V/Clear voltage may be driven low for a fixed period of time, which allows the circuit to unlatch and return to normal operation.

Many modifications and other implementations of the disclosure set forth herein will come to mind to one skilled in the art to which this disclosure pertains having the benefit of the teachings presented in the foregoing descriptions and the associated figures. Therefore, it is to be understood that the disclosure are not to be limited to the specific implementations disclosed and that modifications and other implementations are intended to be included within the scope of the appended claims. Moreover, although the foregoing descriptions and the associated figures describe example implementations in the context of certain example combinations of elements and/or functions, it should be appreciated that different combinations of elements and/or functions may be provided by alternative implementations without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. A circuit with short-circuit protection, the circuit comprising:
   a power semiconductor device;
   a gate driver coupled to the power semiconductor device, and configured to provide a gate drive signal to the power semiconductor device, the gate drive signal being controllable to switch the power semiconductor device on and off;
   circuitry coupled to the power semiconductor device, and configured to detect voltage across the power semiconductor device that indicates whether the power semiconductor device is in desaturation or saturation; and
   a desaturation detector coupled to the gate driver and the circuitry, the desaturation detector configured to receive a first signal from the gate driver that indicates whether the gate drive signal is being provided to the power semiconductor device and thereby whether the power semiconductor device is off or on, and the desaturation detector configured to receive a second signal from the circuitry that indicates whether the power semiconductor device is in desaturation or saturation, the desaturation detector including at least:
      a logic circuit configured to produce a third signal as a function of the first signal and the second signal, the third signal being a logic signal that switches between a first value and a second value, the third signal having the first value in an as-designed condition in which the power semiconductor device is off or in saturation, and the second value in a short-circuit condition in which the power semiconductor device is on and in desaturation;
      a latch circuit configured to produce an output signal as a function of the third signal, the output signal having the first value of the third signal in the as-designed condition, and transitioned and latched to the second value of the third signal in response to a transition from the as-designed condition to the short-circuit condition, the output signal having the second value causing the gate driver to switch the power semiconductor device off; and one or more filters configured to reduce noise within the desaturation detector.

2. The circuit of claim 1, wherein the power semiconductor device is rated to withstand a short circuit for up to a defined period of time, and the one or more filters add propagation delay within the desaturation detector such that a period of time from the transition to the power semiconductor device being switched off is no shorter than one-tenth the defined period of time.

3. The circuit of claim 1, wherein the power semiconductor device is a gallium nitride (GaN) power semiconductor device rated to withstand a short circuit for up to one microsecond, and the one or more filters are one or more sub-microsecond filters.

4. The circuit of claim 1, wherein the one or more filters include input filters before the logic circuit, the input filters being configured to reduce noise in the first signal and the second signal.

5. The circuit of claim 1, wherein the first signal and the second signal are respectively a first analog signal and a second analog signal, and the desaturation detector includes a first comparator and a second comparator configured to receive respective ones of the first analog signal and the second analog signal and produce a first logic signal and a second logic signal corresponding thereto, and wherein the logic circuit being configured to produce the third signal includes being configured to produce the third signal as a function of the first logic signal and the second logic signal.

6. The circuit of claim 5, wherein the first logic signal switches between the first value and the second value when the power semiconductor device is respectively off and on, and the second logic signal switches between the first value and the second value when the power semiconductor device is in respectively saturation and desaturation, and wherein the logic circuit being configured to produce the third signal includes being configured to produce the third signal as a logical conjunction of the first logic signal and the second logic signal.

7. The circuit of claim 1, wherein the one or more filters include a filter between the logic circuit and the latch circuit, the filter being configured to reduce noise in the third signal.

8. The circuit of claim 1, wherein the one or more filters include at least one filter internal to the latch circuit, the at least one filter being configured to reduce noise and add propagation delay within the latch circuit.

9. The circuit of claim 1, wherein the latch circuit includes at least:

a summing junction configured to produce a summing signal as a sum of the third signal and the output signal;

a first filter and a first inverter configured to respectively filter and invert the summing signal to produce a first filtered and inverted signal; and a second filter and a second inverter configured to respectively filter and invert the first filtered and inverted signal to produce a second filtered and inverted signal that is the output signal, wherein the one or more filters include at least the first filter and the second filter.

10. The circuit of claim 9, wherein the latch circuit further includes a feedback path on which the output signal is fed back from an output of the second inverter to the summing junction.

11. The circuit of claim 10, wherein the feedback path includes a diode and a resistor.

12. The circuit of claim 10, wherein the output signal latched to the second value is cleared to the first value in response to the feedback path being pulled to a low voltage level that corresponds to the first value.

13. A desaturation detector for a circuit with short-circuit protection, the desaturation detector being configured to receive a first signal from a gate driver that indicates whether a gate drive signal is being provided to a power semiconductor device and thereby whether the power semiconductor device is off or on, and a second signal from circuitry that indicates whether the power semiconductor device is in desaturation or saturation, the desaturation detector comprising:

a logic circuit configured to produce a third signal as a function of the first signal and the second signal, the third signal being a logic signal that switches between a first value and a second value, the third signal having the first value in an as-designed condition in which the power semiconductor device is off or in saturation, and the second value in a short-circuit condition in which the power semiconductor device is on and in desaturation;

a latch circuit configured to produce an output signal as a function of the third signal, the output signal having the first value of the third signal in the as-designed condition, and transitioned and latched to the second value of the third signal in response to a transition from the as-designed condition to the short-circuit condition, the output signal having the second value causing the gate driver to switch the power semiconductor device off; and one or more filters configured to reduce noise within the desaturation detector.

14. The desaturation detector of claim 13, wherein the power semiconductor device is rated to withstand a short circuit for up to a defined period of time, and the one or more filters add propagation delay within the desaturation detector such that a period of time from the transition to the power semiconductor device being switched off is no shorter than one-tenth the defined period of time.

15. The desaturation detector of claim 13, wherein the power semiconductor device is a gallium nitride (GaN) power semiconductor device rated to withstand a short circuit for up to one microsecond, and the one or more filters are one or more sub-microsecond filters.

16. The desaturation detector of claim 13, wherein the one or more filters include input filters before the logic circuit, the input filters being configured to reduce noise in the first signal and the second signal.

17. The desaturation detector of claim 13, wherein the first signal and the second signal are respectively a first analog signal and a second analog signal, and the desaturation detector includes a first comparator and a second comparator configured to receive respective ones of the first analog signal and the second analog signal and produce a first logic signal and a second logic signal corresponding thereto, and wherein the logic circuit being configured to produce the third signal includes being configured to produce the third signal as a function of the first logic signal and the second logic signal.

18. The desaturation detector of claim 17, wherein the first logic signal switches between the first value and the second value when the power semiconductor device is respectively off and on, and the second logic signal switches between the first value and the second value when the power semiconductor device is in respectively saturation and desaturation, and wherein the logic circuit being configured to produce the third signal includes being configured to produce the third signal as a logical conjunction of the first logic signal and the second logic signal.

19. The desaturation detector of claim 13, wherein the one or more filters include a filter between the logic circuit and the latch circuit, the filter being configured to reduce noise in the third signal.

20. The desaturation detector of claim 13, wherein the one or more filters include at least one filter internal to the latch circuit, the at least one filter being configured to reduce noise and add propagation delay within the latch circuit.

21. The desaturation detector of claim 13, wherein the latch circuit includes at least:
   a summing junction configured to produce a summing signal as a sum of the third signal and the output signal;
   a first filter and a first inverter configured to respectively filter and invert the summing signal to produce a first filtered and inverted signal; and
   a second filter and a second inverter configured to respectively filter and invert the first filtered and inverted signal to produce a second filtered and inverted signal that is the output signal,
   wherein the one or more filters include at least the first filter and the second filter.

22. The desaturation detector of claim 21, wherein the latch circuit further includes a feedback path on which the output signal is fed back from an output of the second inverter to the summing junction.

23. The desaturation detector of claim 22, wherein the feedback path includes a diode and a resistor.

24. The desaturation detector of claim 22, wherein the output signal latched to the second value is cleared to the first value in response to the feedback path being pulled to a low voltage level that corresponds to the first value.

* * * * *